(12) United States Patent
Yoon et al.

(10) Patent No.: US 8,797,204 B2
(45) Date of Patent: Aug. 5, 2014

(54) LOW-POWER AREA-EFFICIENT SAR ADC USING DUAL CAPACITOR ARRAYS

(75) Inventors: Euisik Yoon, Ypsilanti, MI (US); Sun-Il Chang, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 0 days.

(21) Appl. No.: 13/393,685

(22) PCT Filed: Aug. 31, 2010

(86) PCT No.: PCT/US2010/047218
§ 371 (c)(1),
(2), (4) Date: May 21, 2012

(87) PCT Pub. No.: WO2011/028674
PCT Pub. Date: Mar. 10, 2011

(65) Prior Publication Data
US 2012/0218137 A1    Aug. 30, 2012

Related U.S. Application Data

(60) Provisional application No. 61/238,685, filed on Sep. 1, 2009.

(51) Int. Cl.
H03M 1/12    (2006.01)
H03M 1/44    (2006.01)
H03M 1/46    (2006.01)

(52) U.S. Cl.
CPC ............. *H03M 1/442* (2013.01); *H03M 1/466* (2013.01)
USPC ............................ 341/172; 341/155; 341/156

(58) Field of Classification Search
CPC ... H03M 1/468; H03M 1/804; H03M 1/0682; H03M 1/466; H03M 1/403; H03M 2201/3178
USPC ................... 341/118, 120, 155, 156, 144, 172
See application file for complete search history.

(56) References Cited

U.S. PATENT DOCUMENTS

| 5,581,252 | A  | * | 12/1996 | Thomas ........................ 341/144 |
| 5,684,487 | A  | * | 11/1997 | Timko ........................... 341/172 |
| 6,400,302 | B1 | * | 6/2002  | Amazeen et al. ............. 341/172 |
| 6,747,588 | B1 |   | 6/2004  | Huang et al. |
| 6,897,801 | B2 | * | 5/2005  | Confalonieri et al. ........ 341/172 |
| 7,038,609 | B1 |   | 5/2006  | Hurrell |

(Continued)

OTHER PUBLICATIONS

International Search Report for PCT/2010/047218, Apr. 28, 2011, 3 pages.

(Continued)

*Primary Examiner* — Linh Nguyen
(74) *Attorney, Agent, or Firm* — Reising Ethington P.C.

(57) ABSTRACT

An analog to digital converter that comprises a successive approximation register (SAR) having an n bit binary output, a first capacitor array connected to receive some of the bits of the binary output, a second capacitor array connected to receive the remaining bits of the binary output, and a comparator including an output connected to the SAR. The first and second capacitor arrays each have an analog output indicative of the charge stored by capacitors of that array. The comparator includes a pair of inputs, one of which is connected to the analog output of the first capacitor array and the other of which is connected to the analog output of the second capacitor array.

14 Claims, 10 Drawing Sheets

(56) References Cited

U.S. PATENT DOCUMENTS

| | | | |
|---|---|---|---|
| 7,432,844 B2 * | 10/2008 | Mueck et al. | 341/163 |
| 7,439,898 B1 | 10/2008 | Nittala et al. | |
| 7,903,018 B2 * | 3/2011 | Schatzberger et al. | 341/172 |
| 8,004,447 B2 * | 8/2011 | Hsu | 341/161 |
| 8,223,044 B2 * | 7/2012 | Snedeker | 341/118 |
| 8,547,270 B1 * | 10/2013 | Strode | 341/161 |
| 2003/0206038 A1 * | 11/2003 | Mueck et al. | 327/50 |
| 2008/0258959 A1 | 10/2008 | Trifonov et al. | |
| 2011/0032134 A1 * | 2/2011 | Cho et al. | 341/144 |
| 2013/0088375 A1 * | 4/2013 | Wu et al. | 341/120 |

OTHER PUBLICATIONS

Written Opinion for PCT/2010/047218, Apr. 28, 2011, 5 pages.

* cited by examiner

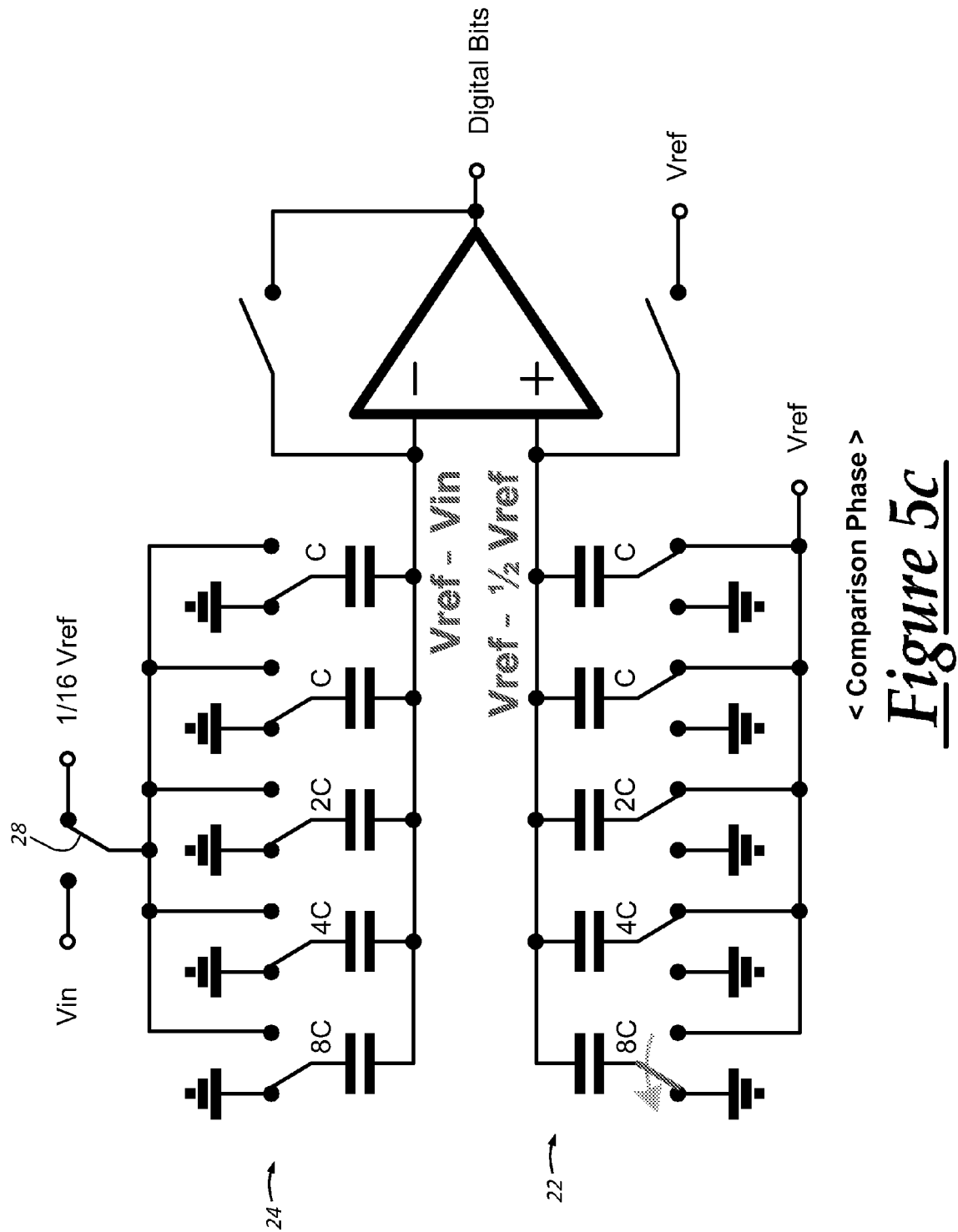

(a) Differential Nonlinearity (b) Integral Nonlinearity

LOW-POWER AREA-EFFICIENT SAR ADC USING DUAL CAPACITOR ARRAYS

STATEMENT REGARDING FEDERALLY-SPONSORED RESEARCH

This invention was made with government support under EEC9986866 awarded by the National Science Foundation. The government has certain rights in the invention.

TECHNICAL FIELD

This invention relates generally to analog to digital converters (ADCs) and, more particularly, to ADCs of the type that operate using a successive approximation register (SAR), comparator, and capacitor array.

BACKGROUND OF THE INVENTION

Recently, multichannel neural interface systems have been implemented to monitor neural activities. For the comprehensive analysis of neural activities, it is desirable to realize simultaneous real-time monitoring of multiple sites in 3D electrode arrays with 64 channels or more. Typically, neural activities such as spike contain most of their information in the bandwidth below 10 kHz with maximum amplitude of ±500 μV. In these microsystems, the neural signals should be amplified and converted into digital signals to be transmitted to wired/wireless communication channels between the implanted system and the external world. Simultaneous access of multiple sites should be done in a manner that utilizes analog-to-digital converters (ADC) having good noise immunity in a small form factor at low power.

A successive approximation register (SAR) ADC is one of the suitable candidates for neural interface applications due to its simplicity, low power consumption, and reasonable resolution. With a gain of 60 dB prior to the ADC, the quantization noise is required to be less than 5 mVrms which can be achieved by 8 bit or higher resolution capability of ADC. FIG. 1 shows a conventional 8 bit SAR ADC structure which typically consists of three parts: capacitor array (for sample and hold and DAC), comparator, and successive approximation register (SAR). For relatively lower resolution ADCs (<6 b), the comparator and SAR consume most of the power. However, as the resolution of ADCs increases, the power consumption required for charging and discharging the capacitor array becomes significant. Also, the total capacitance required for DAC increases exponentially proportional to the number of bits. In the high resolution ADCs, the capacitor array takes most of the area and power consumption. It becomes more important to reduce the total capacitance and area as the number of bits required in ADC increases and multiple implementations of ADCs is needed. You-Kuang et al. reported an effective switching method to reduce the power. However, this switching technique can reduce only half of the power in conventional capacitor arrays. Yang et al. proposed an energy-efficient ADC with a small form factor. However, a relatively complex algorithm may be needed for practical use in neural microsystems.

SUMMARY OF THE INVENTION

In accordance with one embodiment of the invention, there is provided an analog to digital converter that comprises a successive approximation register (SAR) having an n bit binary output, a first capacitor array connected to receive some of the bits of the binary output, a second capacitor array connected to receive the remaining bits of the binary output, and a comparator including an output connected to the SAR. The first and second capacitor arrays each have an analog output indicative of the charge stored by capacitors of that array. The comparator includes a pair of inputs, one of which is connected to the analog output of the first capacitor array and the other of which is connected to the analog output of the second capacitor array.

In accordance with another embodiment of the invention, there is provided an analog to digital converter that comprises a successive approximation register (SAR) having an n-bit binary output that includes a most significant bit (MSB) and a least significant bit (LSB), a comparator, and a plurality of n binary weighted capacitors each of which is associated with one of the bits of the binary output. The binary weighted capacitors include a first capacitor having a unit capacitance C associated with the LSB and one or more other capacitors each of which is associated with one of the other bits of the binary output. Each of the other capacitors has a capacitance value equal to $2^i \times C$ where i and n are integers and $0 \le i \le n/2$.

In accordance with yet another embodiment of the invention, there is provided an analog to digital converter that comprises:

an analog voltage input that receives an inputted analog voltage to be converted to digital form;

a reference voltage input that receives a reference voltage;

a successive approximation register (SAR) having an n-bit binary output including a most significant bit (MSB) and a least significant bit (LSB);

a comparator having inverting and non-inverting inputs and an output that is connected to the SAR;

a first capacitor array comprising an upper digital to analog converter (DAC) having an m-bit binary input, wherein m and n are positive integers with m<n, and wherein each of the m-bits is connected to a corresponding bit of the SAR's binary output including one of the m-bits being connected to the LSB;

a second capacitor array comprising a lower DAC having an n-m bit binary input, wherein each of the n-m bits is connected to a corresponding bit of the SAR's binary output including one of the n-m bits being connected to the MSB;

wherein the first and second capacitor arrays each have an analog output that is connected to a different one of the inputs of the comparator.

BRIEF DESCRIPTION OF THE DRAWINGS

Preferred exemplary embodiments of the invention will hereinafter be described in conjunction with the appended drawings, wherein like designations denote like elements, and wherein:

FIGS. 5(a)-5(c) are schematics of exemplary dual capacitor arrays showing switch operation during various phases of the successive approximation routine;

DETAILED DESCRIPTION OF THE PREFERRED EMBODIMENTS

Disclosed herein is an area-efficient 8 bit SAR ADC using dual capacitor arrays that permits a reduction in the required capacitor array area by a factor of $2^{(n/2)-1}$ compared to the conventional approaches. This feature can not only reduce the total chip area but also the power consumption by reducing the power required for charging/discharging the capacitor array relative to that of prior ADCs.

Figure 1:
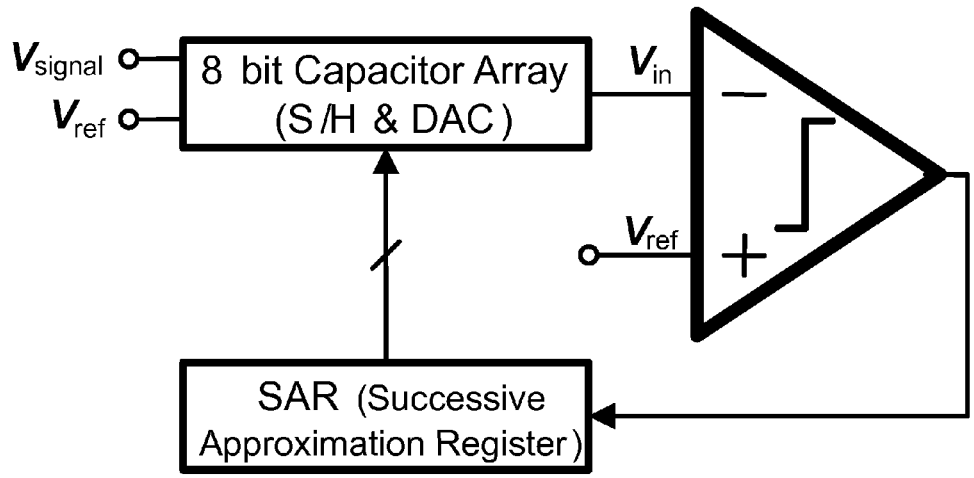
FIG. 1 is a schematic diagram of a conventional SAR ADC.
Figure 2:
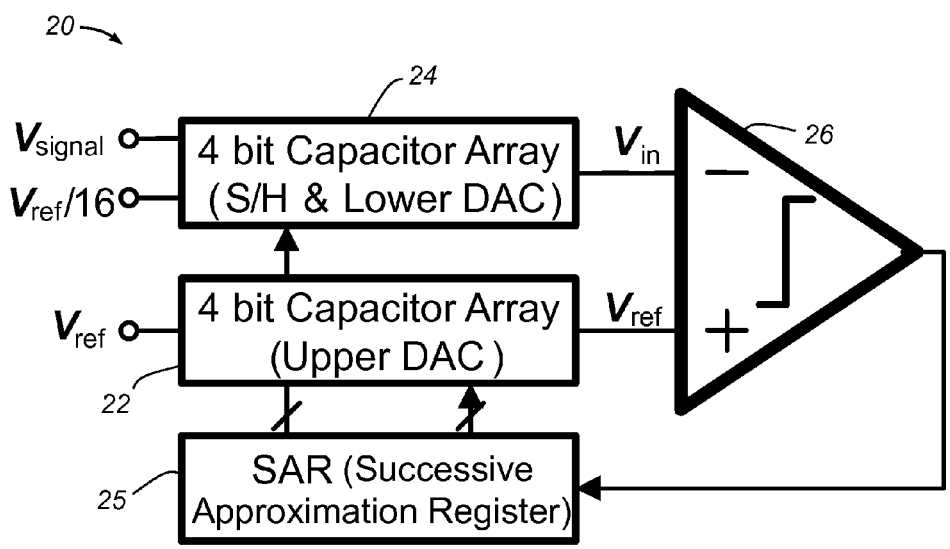
FIG. 2 is a schematic diagram of a dual capacitor array SAR ADC constructed in accordance with an embodiment of the present invention.

The use of two smaller capacitor arrays instead of one much larger one is accomplished by utilizing a circuit in which the successive approximation iterations are carried out on both sides of comparator inputs using dual capacitor arrays rather than only on one side. FIG. 2 depicts an exemplary embodiment 20 wherein an 8 bit DAC is implemented using two 4 bit capacitor arrays 22, 24, an SAR 25, and a comparator 26. In the illustrated embodiment, the capacitor arrays 22, 24 have the same construction, but can be different in other embodiments. The upper DAC 22 is connected to the non-inverting input of the comparator 26 and is used to quantize the upper (most significant) 4 bits, while the lower DAC 24 is connected to the inverting input and does lower (least significant) 4 bits. An advantage of the dual capacitor arrays 22, 24 is the reduction of the total capacitance and area for DAC capacitors by a factor of:

$$\text{Reduction Factor} = 2^{\frac{n}{2}-1},$$

where n is the number of bits. For example, for 8 and 10 bit resolutions, the reduction factors become 8 and 16, respectively. And the power consumed by the combined capacitor array would be reduced by the same reduction factor. This advantage is more effective for higher resolution ADCs. By applying this technique, one can effectively implement the ADCs within a given area and power budget. This feature can be used to easily equip a neural interface system with a simultaneous real-time monitor capability of the multiple neural activities.

Figure 3:
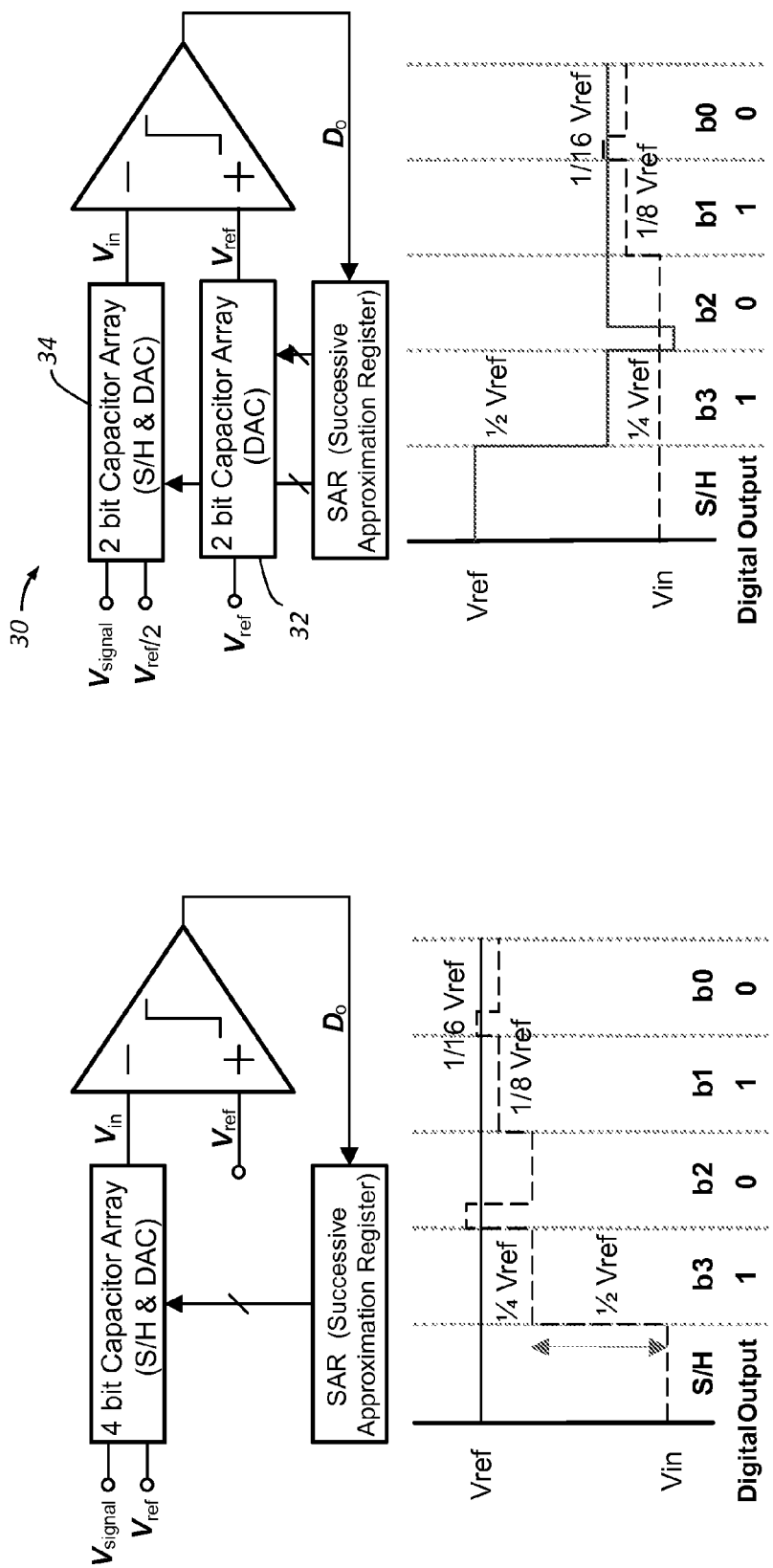
FIG. 3 depicts 4 bit SAR ADC operation examples for (a) a conventional SAR ADC and (b) a dual capacitor array SAR ADC constructed in accordance with an embodiment of the present invention.

FIG. 3(a) shows an example of 4 bit ADC operations in conventional SAR ADC and FIG. 3(b) shows the same operation using a dual capacitor array ADC 30. Basic operations of the 4 bit SAR ADC can be divided into two steps: sample/hold and four iterations of successive approximations. During each approximation step, $V_{in}$ can be expressed as:

$$V_{in}[n] = V_{in}[n-1] + \frac{Vref}{2^{n+1}}(1-(-1)^{D_o[n]})$$

If the $V_{in}[n]$ is smaller than $V_{ref}$, the comparator output is 1, and the SAR sets the output $b_n=1$ and generates the control signal to make $V_{in}[n]$ be $V_{in}[n-1]+V_{ref}/2^n$. If the $V_{in}$ is greater than $V_{ref}$, the output is $b_n=0$, and the $V_{in}$ stays from previous step. The red line shows $V_{in}$ from each steps. By repeating this step four times, the signal can be quantized into a 4 bit resolution.

As shown FIG. 3(a), the conventional ADC is performing the approximation in the one input node of the comparator while the other input side is fixed to reference. On the other hand, the dual capacitor array ADC 30 of FIG. 3(b) uses both sides (signal side: 2 bit and reference side: 2 bit) to perform the approximation. During the first two steps, the upper DAC 32 is operated to approximate $V_{ref}$ to $V_{in}$ as shown by the upper $V_{ref}$ line in FIG. 3(b). Successively, during the following two steps, $V_{in}$ is approximated to $V_{ref}$ using the lower DAC 34. After four steps, the example signal is digitized as 1010. For the same resolution, the FIG. 3(b) ADC 30 requires only half (=1/reduction factor=½$^{(n/2)-1}$) the area in the capacitor array and consumes half the power as compared to the conventional ADC of FIG. 3(a). As indicated in FIGS. 2 and 3(b), to carry out the successive approximation using the dual capacitor arrays, each of the circuits 20, 30 utilize not only the $V_{ref}$, but also an additional reference voltage $V_{ref}/2^{n/2}$, which can be provided (generated) internally or externally.

Figure 4:
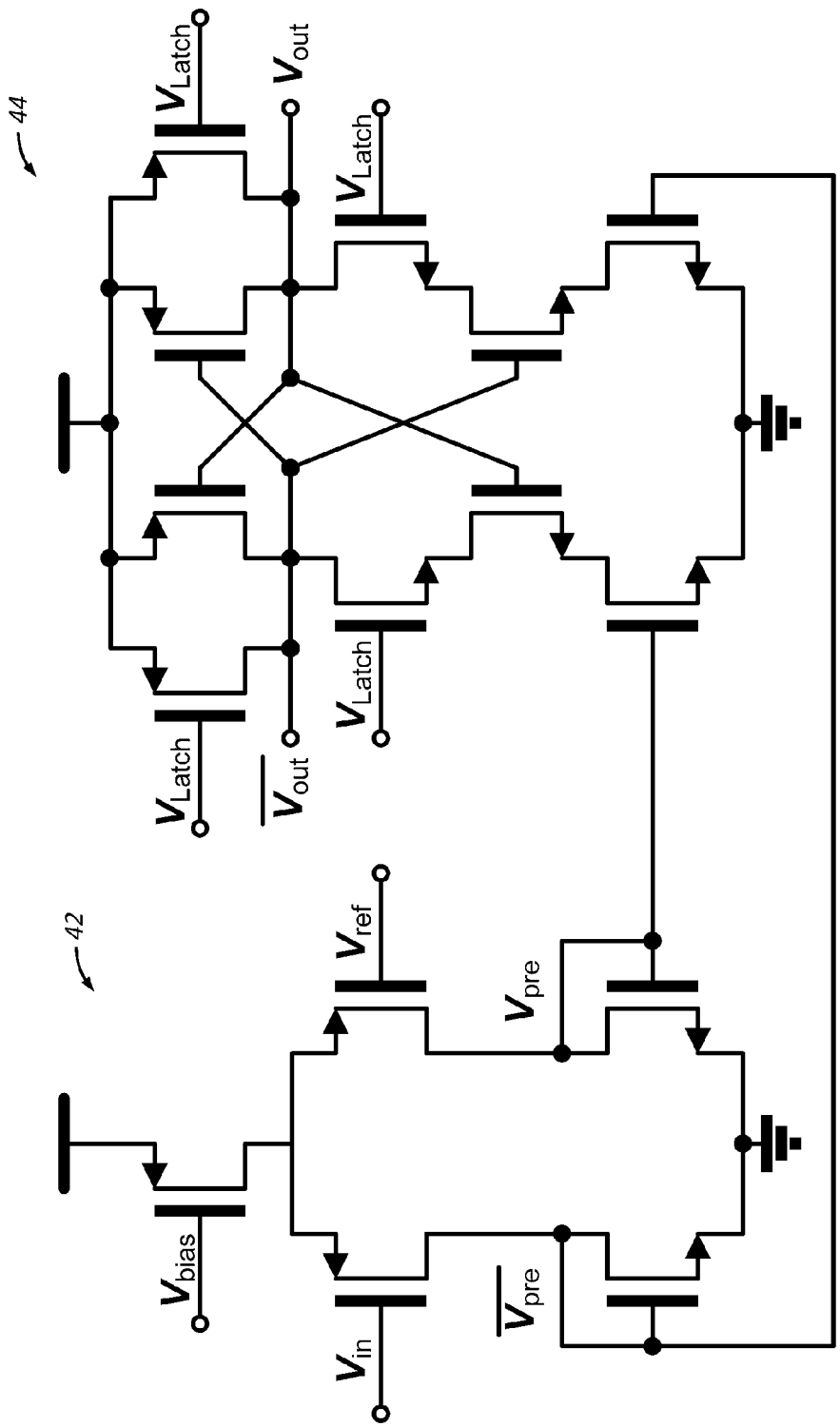
FIG. 4 is a schematic of the comparator of the ADC of FIG. 2.

FIG. 4 shows the schematic diagram of the comparator 26. Due to smaller capacitance in the dual capacitor arrays 22, 24, the regenerative comparator may cause kickback effect during the regenerative phase. This coupling effect between input and output may severely deteriorate the performance of ADC. To suppress this phenomenon, a buffer stage 42 with gain of 10 is introduced prior to the regenerative comparator 44. The difference between two inputs ($V_{in}$ and $V_{ref}$) is sampled and amplified through the buffer stage 42 and then forwarded to the regenerative stage 44 during reset phase. In the positive rising edge of $V_{Latch}$ when regenerative phase starts, the difference is amplified and eventually the polarity of the difference is determined. The dual capacitor array ADC can use two identical capacitor arrays that are located on both input nodes of the comparator. This configuration helps to suppress the comparator offset which may come from the charge injection from the reset switches or any unexpected possible leakage path.

Figure 5A:
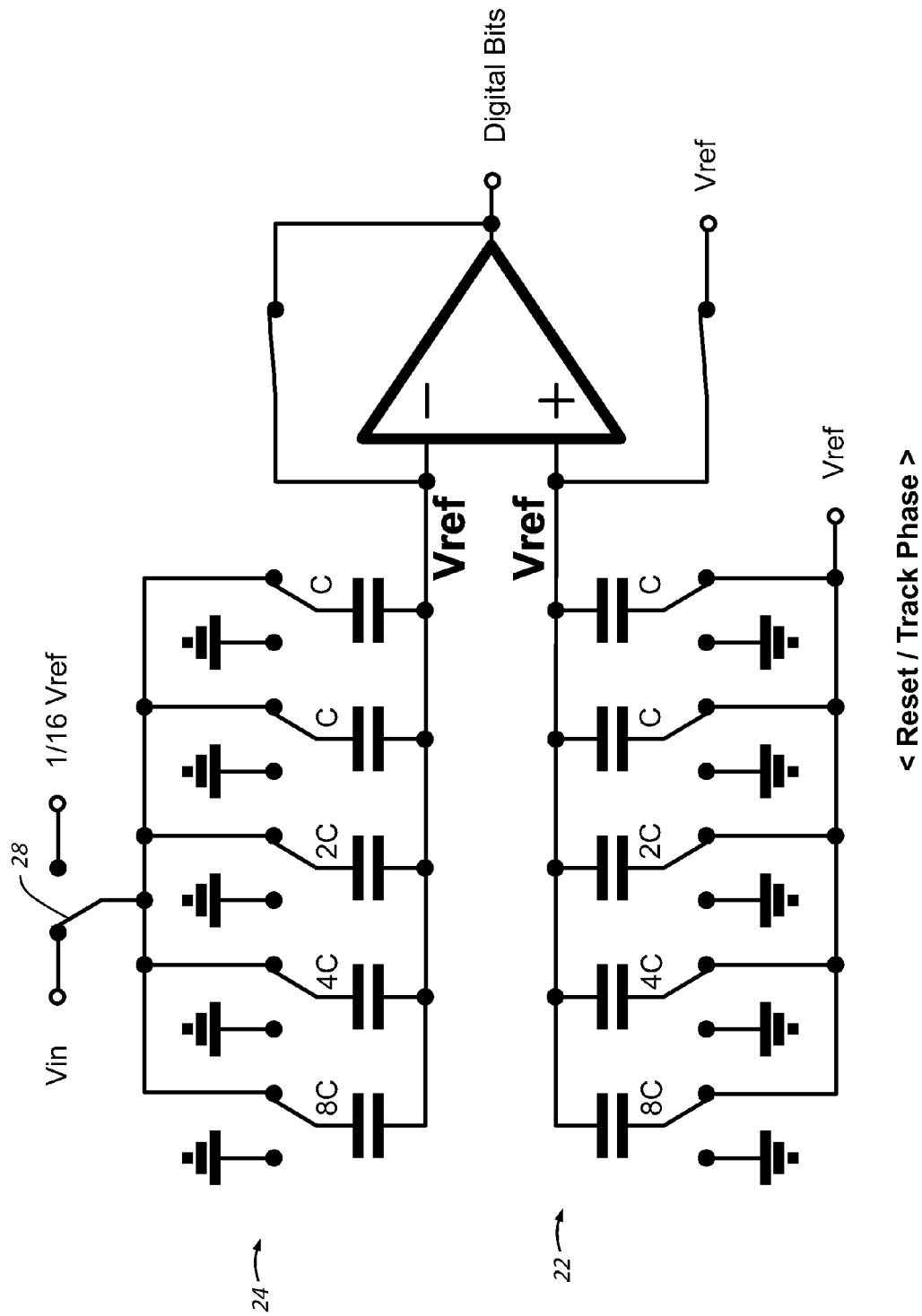
Figure 5B:
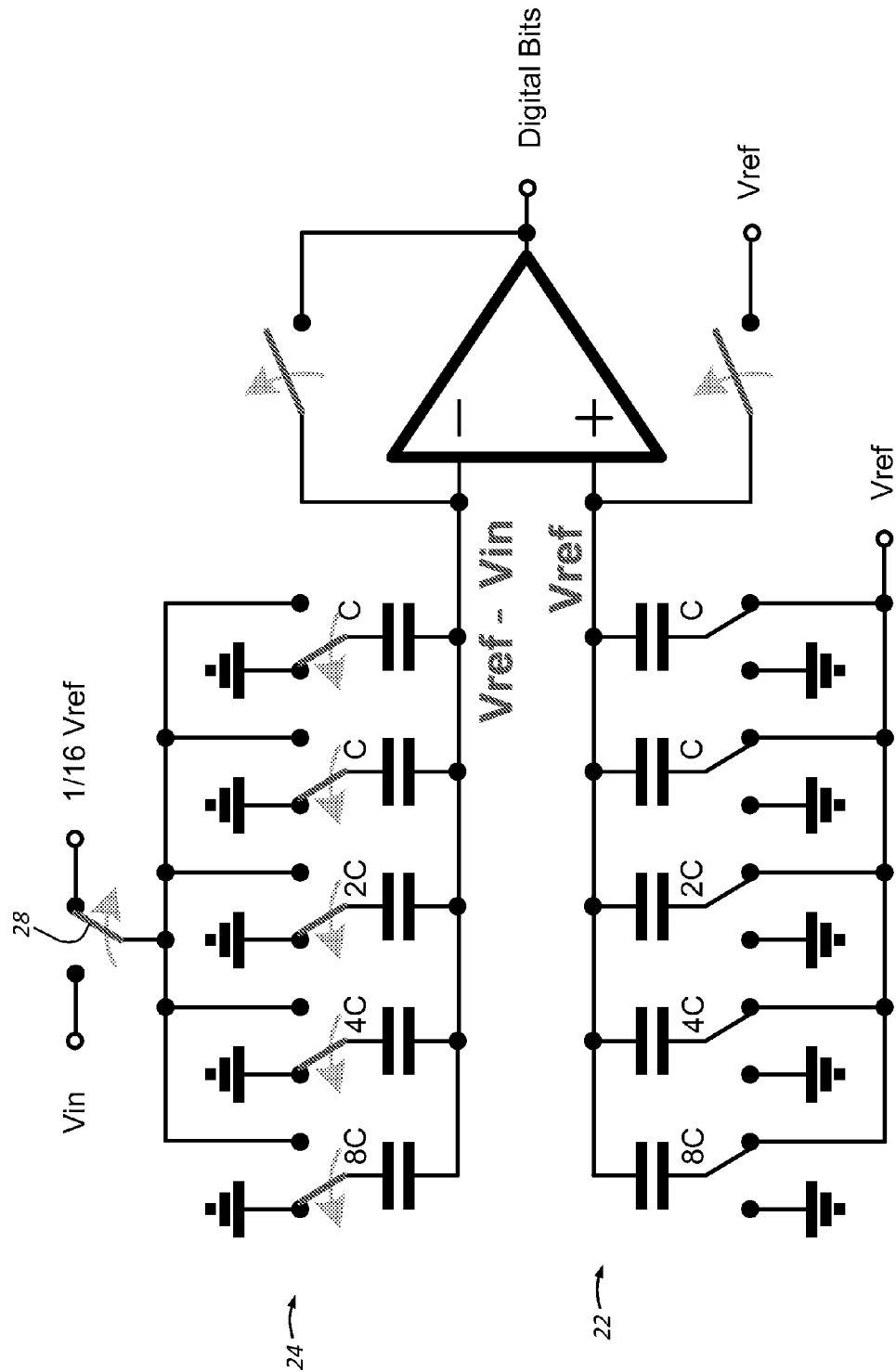

As shown in FIG. 5(a), to implement both upper and lower DACs, two identical capacitor arrays 22, 24 have been implemented using MIM capacitors, where a unit capacitance is given as 100 fF. Total capacitance for the area-efficient 8 bit ADC is $2 \times 2^4 \times C = 32$ C where C is the unit capacitance of array corresponding to the least significant bit. The two 4 bit capacitor arrays are identical except that the lower (least significant bits) DAC 24 has an additional switch 28 to sample and hold the signal during the comparison. FIG. 5(a) shows the ADC switch position during the reset/track phase of the overall successive approximation routine. FIG. 5(b) shows the sample phase and FIG. 5(c) shows the comparison phase.

Figure 6:
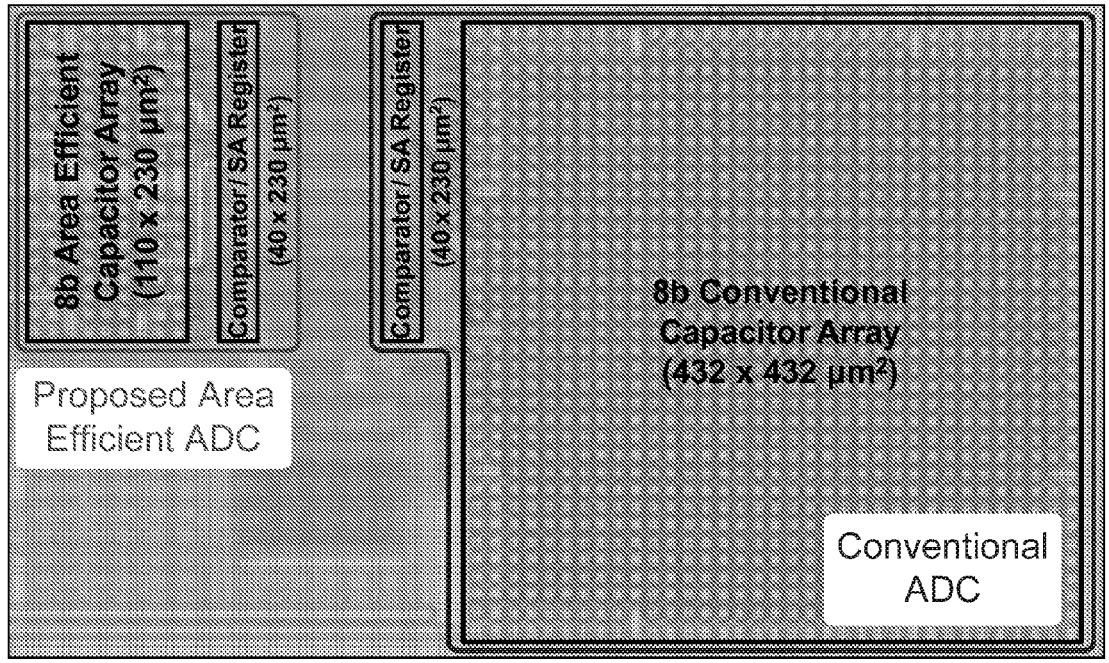
FIG. 6 is a microphotograph of fabricated ADCs.

FIG. 6 is a photograph of fabricated conventional and dual capacitor array ADCs. This figure depicts an example of the chip area savings obtainable using the present invention. These devices were fabricated using a 0.25 µm 1P5M CMOS process. To evaluate the proposed ADC, both ADCs were measured and characterized. The total active area of the dual capacitor array ADC is 0.035 mm², while the conventional ADC occupies 0.196 mm². Performance of the ADCs is summarized in Table 1. The fabricated ADCs have the resolution of 8 bit with the sampling frequency of 20 kS/s. The total power consumption of the dual capacitor array ADC is 680 nW at 1.8V (Analog) and 2.5V (digital) supply. The comparator consumes most of power (~498 nW), and the proposed capacitor array consumes 92 nW from 1.2 V input range, while the conventional capacitor array consumes ~737 nW, which is eight times higher and even higher than the comparator.

TABLE I

| Parameter | Measured |
|---|---|
| Technology | 0.25 μm 1P5M CMOS |
| Supply Voltage | 1.8 V (Analog)/2.5 V (Digital) |
| Sampling Frequency | 20 kS/s |
| Power Consumption | 680 nW |
| INL | <±0.5 LSB |
| DNL | <±0.5 LSB |
| SNDR | 42.82 ± 0.47 dB |
| SFDR | 57.90 ± 2.82 dB |
| THD | −53.58 ± 2.15 dB |
| Resolution/ENOB | 8 bits/6.65 ± 0.07 bits |
| Figure of Merit | 0.34 pJ/conversion |
| Area | 0.035 mm$^2$ |

Figure 7:
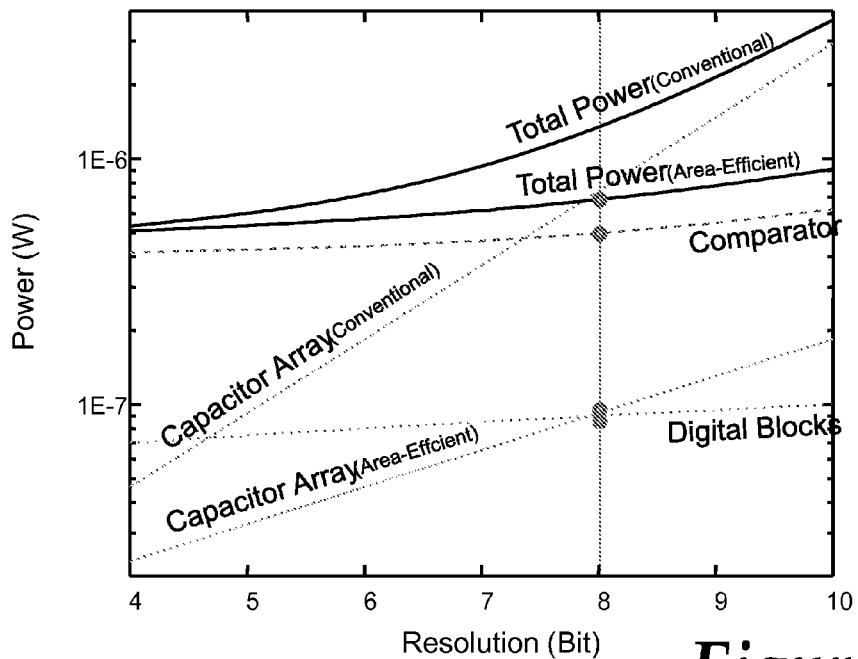
FIG. 7 is a comparative graph of power consumption with respect to the ADC resolution.

An estimated power consumption as a function of resolutions in ADC is shown in FIG. 7. The total power consumption increases with resolution. Especially, the power consumption by the conventional capacitor array becomes significant when the resolution is above 7 bit, and increases even exponentially with resolution ($2^n$). On the other hand, the power consumption of the dual capacitor array slowly increases by a factor of $2^{n/2}$, and consumes much less power. Even in 10 bit resolution, the power consumption of the dual capacitor array stays below that of the comparator.

Figure 8:
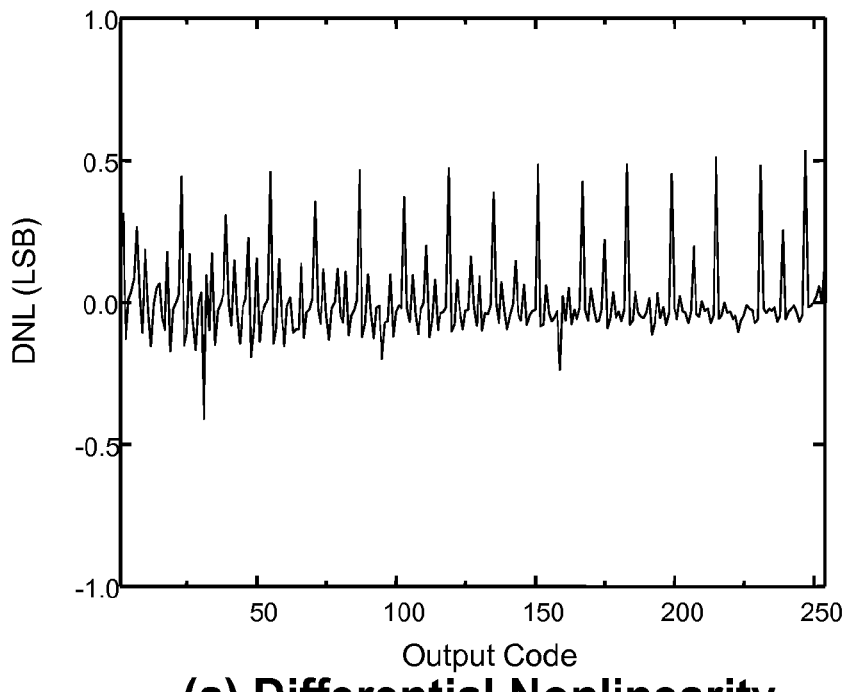
FIG. 8 are graphs of the measured (a) DNL and (b) INL of the ADC of FIG. 2.
Figure 8:
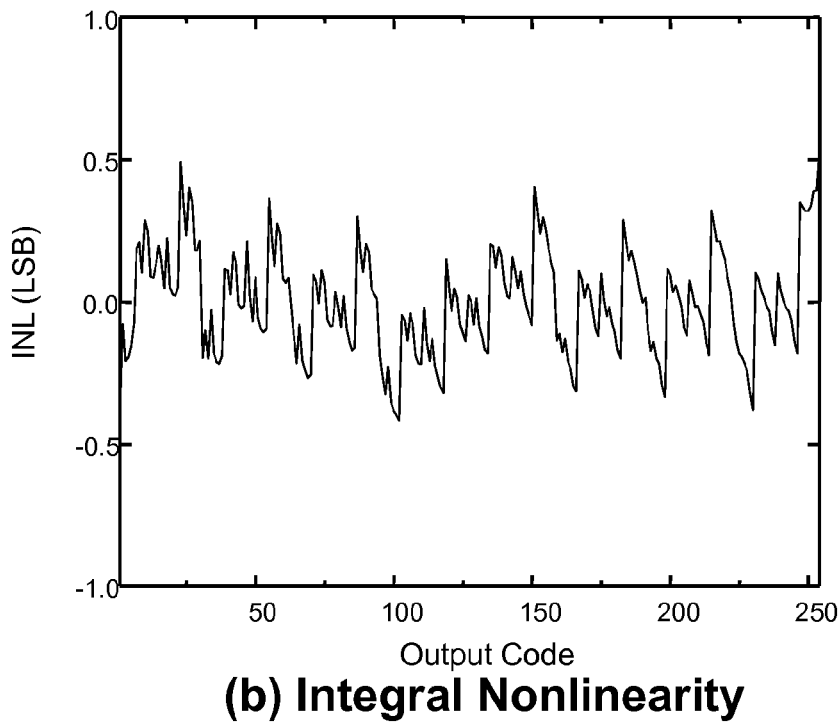

FIG. 8 shows the measurement results of differential nonlinearity (DNL) and integral nonlinearity (INL). The measured INL and DNL are both below ±0.5 LSB.

Figure 9:
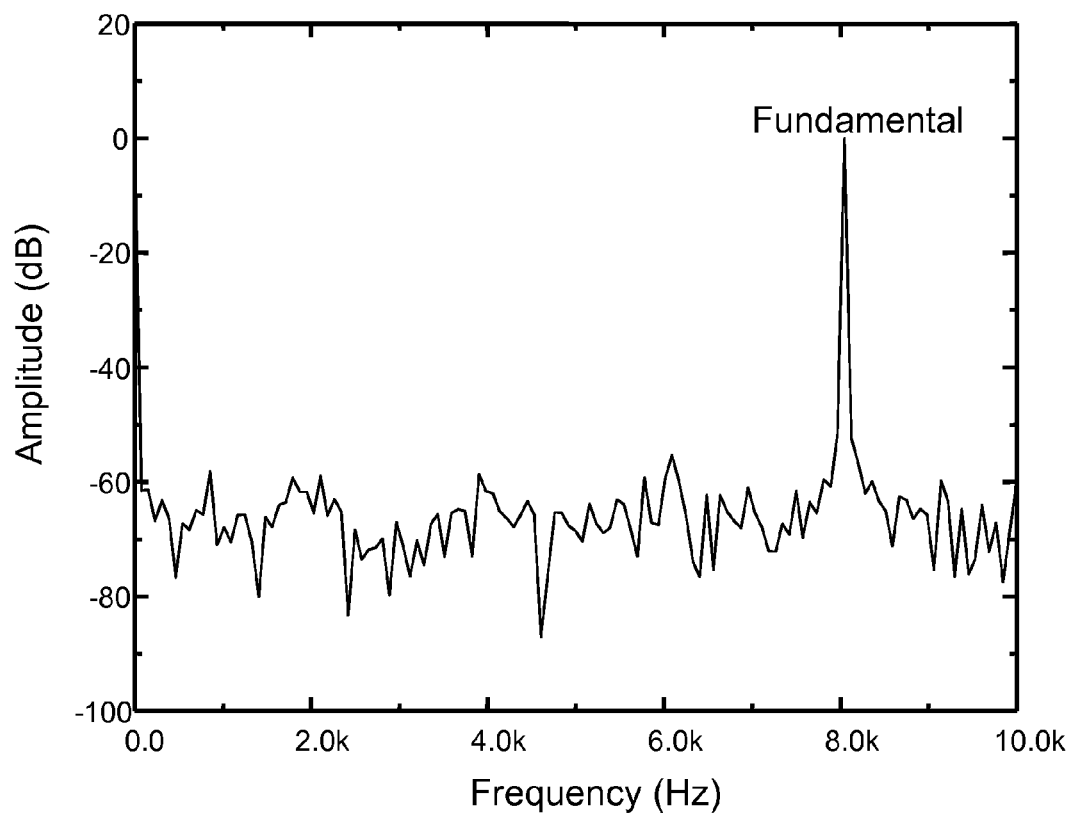
FIG. 9 is an FFT plot of the measured digital output codes for an input frequency of 8046.875 Hz using the ADC of FIG. 2.

The measured 8 bits digital output codes are analyzed using the FFT from the input signal of 8046.875 Hz and 256 samples shown in FIG. 9. The measured signal-to-noise and distortion ratio (SNDR) and spurious-free dynamic range (SFDR) are 42.82±0.47 dB and 57.90±2.82 dB, respectively. Total harmonic distortion (THD) and effective number of bit (ENOB) are −53.58±2.15 dB and 6.65±0.07 bits, respectively.

Figure 10:
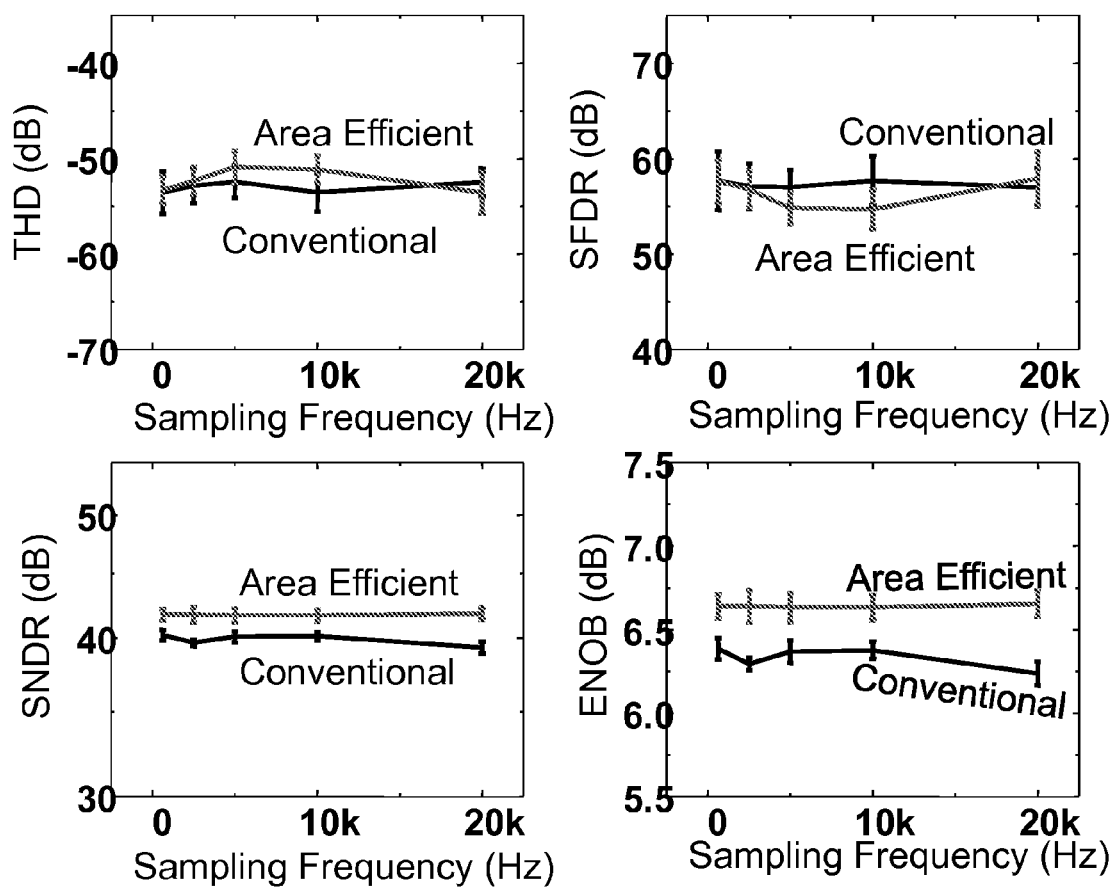
FIG. 10 are comparative graphs of the measured dynamic characteristics with different sampling frequency for the ADC of FIG. 2.

The dynamic characteristics of the ADC with different sampling frequencies was also measured to test leakage. Leakage can be significant in small capacitor arrays at low sampling frequency (<1 kS/s) such as EEG or ECoG applications. The results are shown in FIG. 10. The performance of the dual capacitor array ADC remains constant with the range of the various sampling frequencies (625 Hz~20 kHz) indicating leakage is not a serious issue with the small capacitance array bank.

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. An analog to digital converter, comprising:
    a successive approximation register (SAR) having an n-bit binary output;
    a first capacitor array connected to receive some of the bits of the binary output;
    a second capacitor array connected to receive the remaining bits of the binary output, wherein the first and second capacitor arrays each have an analog output indicative of the charge stored by capacitors of that array, the first capacitor array uses a first reference voltage level, and the second capacitor array uses a second reference voltage equal to the first reference voltage divided by $2^{n/2}$; and
    a comparator including an output connected to the SAR and including a pair of inputs, one of which is connected to the analog output of the first capacitor array and the other of which is connected to the analog output of the second capacitor array;
    wherein the analog to digital converter includes an analog voltage input that receives an inputted analog voltage to be converted to digital form, and wherein the first capacitor array includes a switch that interconnects the analog voltage input to the capacitors of the first capacitor array such that, when connected to the analog voltage input by the switch, the first capacitor array samples the inputted analog voltage.

2. An analog to digital converter as defined in claim 1, wherein n is a positive, even integer and wherein each capacitor array is connected to receive n/2 of the bits of the binary output.

3. An analog to digital converter as defined in claim 2, wherein the first capacitor array is connected to the SAR to receive the least significant bits of the binary output and the second capacitor array is connected to the SAR to receive the most significant bits of the binary output, and wherein the pair of inputs of the comparator include an inverting input connected to the analog output of the first capacitor array and a non-inverting input connected to the analog output of the second capacitor array.

4. An analog to digital converter as defined in claim 2, wherein each capacitor array includes n/2 binary weighted capacitors, and wherein the total capacitance of the binary weighted capacitors in each array is $2^{(n/2)}$.

5. An analog to digital converter, comprising:
    a successive approximation register (SAR) having an n-bit binary output that includes a most significant bit (MSB) and a least significant bit (LSB);
    a comparator; and
    a plurality of n binary weighted capacitors each of which is associated with one of the bits of the binary output, the binary weighted capacitors including a first capacitor having a unit capacitance C associated with the LSB and one or more other capacitors each of which is associated with one of the other bits of the binary output and each of which has a capacitance value equal to $2^i \times C$ where i and n are integers and $0 \le i \le n/2$;
    wherein the binary weighted capacitors are grouped into first and second capacitor arrays and the first capacitor array uses a first reference voltage whereas the second capacitor array uses a second reference voltage equal to the first reference voltage divided by $2^{n/2}$ and the analog to digital converter includes an analog voltage input that receives an inputted analog voltage to be converted to digital form, and further includes a switch that interconnects the analog voltage input to a group of the capacitors associated with the LSB such that, when connected to the analog voltage input by the switch, the capacitors of the group associated with the LSB each receive the inputted analog voltage.

6. An analog to digital converter as defined in claim 5, wherein each of the binary weighted capacitors comprises a single capacitor.

7. An analog to digital converter as defined in claim 5, wherein at least one of the binary weighted capacitors comprises a plurality of individual capacitors connected together to provide a capacitance equal to $2^i \times C$.

8. An analog to digital converter as defined in claim 5, wherein the bits of the binary output of the SAR are each connected to their associated binary weighted capacitors such that, during one or more successive approximation iterations, the bits of the binary output control the storage of charge on their associated binary weighted capacitors.

9. An analog to digital converter as defined in claim 5, wherein n is a positive, even integer and wherein the binary weighted capacitors are grouped into first and second capacitor arrays, each of said arrays containing n/2 of the binary weighted capacitors and wherein each of the binary weighted capacitors contained in each array has a capacitance that is different than the capacitance of the other binary weighted capacitors in that array.

10. An analog to digital converter as defined in claim 9, wherein the first capacitor array is connected to an inverting input of the comparator and the second capacitor array is connected to an non-inverting input of the comparator.

11. An analog to digital converter, comprising:
an analog voltage input that receives an inputted analog voltage to be converted to digital form;
a successive approximation register (SAR) having an n-bit binary output including a most significant bit (MSB) and a least significant bit (LSB);
a comparator having inverting and non-inverting inputs and an output that is connected to the SAR;
a first capacitor array comprising an upper digital to analog converter (DAC) having an m-bit binary input, wherein m and n are positive integers with m<n, and wherein each of the m-bits is connected to a corresponding bit of the SAR's binary output including one of the m-bits being connected to the LSB;
a second capacitor array comprising a lower DAC having an n-m bit binary input, wherein each of the n-m bits is connected to a corresponding bit of the SAR's binary output including one of the n-m bits being connected to the MSB, wherein the first capacitor array uses a first reference voltage level and the second capacitor array uses a second reference voltage equal to the first reference voltage divided by $2^{n/2}$; and
a switch selectively interconnecting the first capacitor array to either the analog voltage input or a reference voltage;
wherein the first capacitor array comprises a plurality of switched capacitors, each of which are connectable via the switch to either the analog voltage input or the reference voltage;
wherein the first and second capacitor arrays each have an analog output that is connected to a different one of the inputs of the comparator.

12. An analog to digital converter as defined in claim 11, wherein the first capacitor array is connected to the SAR to receive the least significant bits of the binary output and the second capacitor array is connected to the SAR to receive the most significant bits of the binary output, and wherein the analog output of the first capacitor array is connected to the inverting input of the comparator and the analog input of the second capacitor array is connected to the non-inverting input of the comparator.

13. An analog to digital converter as defined in claim 11, wherein n is an even integer and m=n/2.

14. An analog to digital converter as defined in claim 13, wherein the SAR, comparator, and capacitor arrays together comprise an integrated circuit formed on a chip, and wherein the area on the chip occupied by the capacitor arrays is less than three times the total area on the chip that is occupied by the comparator and SAR.

* * * * *